(12) United States Patent
Caywood et al.

(10) Patent No.: US 6,451,652 B1
(45) Date of Patent: Sep. 17, 2002

(54) METHOD FOR FORMING AN EEPROM CELL TOGETHER WITH TRANSISTOR FOR PERIPHERAL CIRCUITS

(75) Inventors: John Caywood, Sunnyvale, CA (US); Gregorio Spadea, Saratoga, CA (US)

(73) Assignees: The John Millard and Pamela Ann Caywood 1989 Revocable Living Trust, Sunnyvale, CA (US); Virtual Silicon Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/656,730

(22) Filed: Sep. 7, 2000

Related U.S. Application Data
(60) Provisional application No. 60/154,155, filed on Sep. 15, 1999.

(51) Int. Cl.[7] .............................................. H01L 21/336
(52) U.S. Cl. ...................... 438/257; 438/119; 438/200; 438/201; 438/258; 438/266; 438/275; 438/276
(58) Field of Search ................................ 438/257, 199, 438/201, 200, 217, 258, 266, 275, 276; 257/77, 316, 412

(56) References Cited

U.S. PATENT DOCUMENTS

| | | | | |
|---|---|---|---|---|
| 5,296,393 A | * | 3/1994 | Smayling et al. | .............. 437/34 |
| 5,886,368 A | * | 3/1999 | Forbees et al. | ................ 257/77 |
| 5,986,931 A | * | 11/1999 | Caywood | ............... 365/185.06 |
| 6,124,157 A | * | 9/2000 | Rahim | ......................... 438/201 |

* cited by examiner

Primary Examiner—Matthew Smith
Assistant Examiner—V. Yevsikov
(74) Attorney, Agent, or Firm—Sierra Patent Group, Ltd.

(57) ABSTRACT

A method for forming an EEPROM cell together with transistors for peripheral circuits is disclosed. The method results in having a predetermined amount of material remaining proximate to the edge of the electrode, thereby forming a structure that extends a short distance beyond the sides of the electrode. An additional method for forming an trilayer EEPROM cell together with transistors for peripheral circuits is also disclosed, which results trilayer layer being restricted to covering the electrode and a small proximate region extending over the substrate surface. Two shoulders may also be etched into the sidewalls of the oxide layer which lie along the edges of said electrode.

11 Claims, 3 Drawing Sheets

METHOD FOR FORMING AN EEPROM CELL TOGETHER WITH TRANSISTOR FOR PERIPHERAL CIRCUITS

CROSS REFERENCE TO RELATED APPLICATIONS

This application claims priority from U.S. Provisional Application Serial No. 60/154,155 filed Sep. 15, 1999, the full disclosure of which is hereby incorporated by reference.

BACKGROUND OF THE INVENTION

1. Field of the Invention

The present invention relates generally to semiconductors. In particular, the present invention relates to forming an EEPROM cell together with transistors for peripheral circuits.

2. The Prior Art

Background

In the art of semiconductor manufacturing, the usual practice in defining transistor gates is to deposit the conducting gate material and then form a layer of photosensitive material, which is usually referred to as photoresist, on top of the conducting material. The photoresist is selectively exposed to light and then chemically treated to "develop" the resist in order to leave the photoresist in only the regions in which it is desired to form the gate electrodes. Subsequent to the development step, the gate electrode material is etched to remove it from the regions not protected by photoresist.

In recent applications, an electrode may be formed that provides select gates in the regions on the two sides of an underlying floating gate electrode and also acts to partially control the potential on the floating gate via capacitive coupling. This electrode is often referred to as the control gate electrode.

U.S. Pat. No. 5,986,931, assigned to one of the inventors of this patent, describes such a nonvolatile memory cell structure such and is shown in FIG. 1. The cell consists of a floating gate 122, i.e. a gate without direct electrical connection, formed on a first layer of polysilicon overlapped by a second layer of polysilicon 120 which acts as a control gate. There is a thin layer of silicon oxide 130 between the floating gate and an n-well formed in the substrate. The floating gate is separated from the control gate by a dielectric layer 132, which is often formed of a sandwich structure consisting of a silicon oxide layer, a silicon nitride layer, and a silicon oxide layer. The control gate is separated from the n-well in the regions of direct overlap by two dielectric layers 134 and 136 which are thicker than the oxide layer 130 so that the can withstand the potential of greater than 10 V that is applied between the control gate and n-well during programming.

There is an active region 108 that is surrounded by thick oxide which acts as isolation to separate the transistors from those in neighboring cells. The portions of the active region not covered by polysilicon, are doped heavily p-type to form a drain 126 and a source 128 for the cell transistors. The cell contains three transistors in series. There is a select transistor between drain 126 and floating gate; the channel of this transistor lies in the active region under the dielectric 134. There is a floating gate memory transistor whose channel region lies in the active region under the thin oxide 130. There is a virtual source/drain between the drain select transistor and the floating gate transistor. The channel of a second select transistor is formed in the active region under the dielectric 136. Diffusion 128 is the source for the source select transistor.

As is discussed therein, the voltage between source and drain on this cell never exceeds 1–2 V in normal operation. Because of this, the channel length of the two select transistors can be quite short without the applied source-drain bias causing punch through. It is desirable to make the select transistors as short as possible without adverse electrical effects because this both allows the cell to be smaller and increases the magnitude of the current through a conducting cell during read.

However, certain problems arise in manufacturing the cell of FIG. 1 as the select gates become very short. On the one hand, if the select gates become shorter than the misalignment between the photoresist pattern that defines the control gate electrode and the floating gate, complete etching of the control gate conductor layer results in exposing one side of the floating gate while the control gate on the other side is longer than twice the designed length of the floating gate. Both of these effects are undesirable.

Additionally, exposing one side of the floating gate changes the capacitive coupling between the floating gate and the control gate. Furthermore, forming a control gate on one side of the floating gate that is longer than the design length of the two control gates, one on each side of the floating gate, will reduce the read current. Finally, it is known that it is difficult to completely remove a conducting layer from the side of a vertical feature with the result that what are referred to as stringers remain along the side of a vertical feature.

The prior art has been deficient in forming the structure of FIG. 1 without encountering these difficulties.

It has been previously suggested that the "stringer" can be used to form an electrode along one side of a gate electrode. Such a process may be found in A. T. Wu, et al, "A Novel High-Speed, 5-Volt Programming EPROM Structure", IEDM Technical Digest, pp. 584–7, (1986). The approach suggested by Wu el al contemplates removing the conducting material from atop the first gate electrode in a maskless operation.

Hence, there is need for a process for forming a semiconductor device whereby a photomask is employed in conjunction with the use of "stringers" to form a control gate that has well defined capacitive coupling to the floating gate as well as select gates in series with the floating gate of well defined length.

BRIEF DESCRIPTION OF THE INVENTION

The invention satisfies the above needs. The present invention relates generally to semiconductors. In particular, the present invention relates to forming an EEPROM cell together with transistors for peripheral circuits.

A method for forming an EEPROM cell together with transistors for peripheral circuits is disclosed. A method according to one aspect of the invention comprises providing a semiconductor substrate, a gate dielectric layer disposed over said substrate, an electrode disposed over said gate dielectric layer, where the electrode is further enveloped in an electrode dielectric layer, and a select gate dielectric layer is disposed on either side of the electrode dielectric layer; conformally depositing a conductive layer over the electrode dielectric layer and the gate dielectric layers; coating the conductive layer with photoresist; selectively exposing the photoresist to radiation to form a sidewall over the electrode; anisotropically etching the conductive layer; and whereby the method is characterized in that a predetermined amount of material remains proximate to the edge of the electrode forming a structure that extends a short distance beyond the sides of the electrode.

Additional aspects of the above method include conformally depositing a conductive layer over the electrode dielectric layer and the gate dielectric layers such that the conformal deposit forms a sidewall over the electrode and the electrode enveloping dielectric layer, where the conductive layer extends beyond the edge of the electrode dielectric by an amount equal to the thickness of the conducting layer.

A further aspect of the present invention is disclosed wherein the act of coating said conductive layer with photoresist is further characterized in that the photoresist is positioned such that the edge of the photoresist lies between the outer edge of the electrode dielectric layer and the sidewall of the conductive layer. Yet a further aspect is disclosed wherein the vertical thickness of the sidewall is approximately equal to the sum of the thickness of the electrode, the thickness of the conducting layer, and the thickness of the electrode dielectric layer.

An additional aspect of the present invention is disclosed, wherein the act of anisotropically etching the conductive layer removes an amount of material equal in thickness to the thickness of the conducting layer+$\Delta$, where $\Delta$<the sum of the thickness of the electrode+the thickness of the gate dielectric layer. $\Delta$ may be chosen to be 20% to 30% of the thickness of the conductive layer. The etching of the conductive layer may result in a layer of conductive material remaining which extends a distance from the electrode dielectric layer equal to the thickness of the conducting layer.

A method for forming an trilayer EEPROM cell together with transistors for peripheral circuits is also disclosed. The method comprises: providing a semiconductor substrate, the substrate having a gate dielectric layer disposed over the substrate and an electrode disposed over the gate dielectric layer; conformally forming a trilayer dielectric layer over the electrode and over the exposed surface of the substrate; conformally forming a layer of oxide over the exposed surface of the trilayer dielectric; depositing a layer of photoresist over the oxide layer; etching the photoresist; and whereby the method is characterized in that the trilayer layer is restricted to covering the electrode and a small proximate region extending over the substrate surface.

A further aspect of the present invention is disclosed, wherein the thickness of the oxide layer is chosen to be greater than twice the placement accuracy of an edge of a photoresist pattern in the technology being employed. Additionally, the present invention may that the photoresist layer is patterned such that the edges of the photoresist pattern lie approximately half way between the vertical faces of the trilayer dielectric that are not in contact with the floating electrode and the exposed vertical faces of the oxide layer. The etch may also be chosen to remove an amount of the oxide layer equal in thickness to about 130% of the oxide layer.

A further aspect of the present invention is disclosed the etching results in two shoulders being etched into the sidewalls of said oxide layer which lie along the edges of said electrode.

BRIEF DESCRIPTION OF THE DRAWING FIGURES

DETAILED DESCRIPTION OF PREFERRED EMBODIMENTS

Persons of ordinary skill in the art will realize that the following description of the present invention is illustrative only and not in any way limiting. Other embodiments of the invention will readily suggest themselves to such skilled persons having the benefit of this disclosure.

Figure 1A:
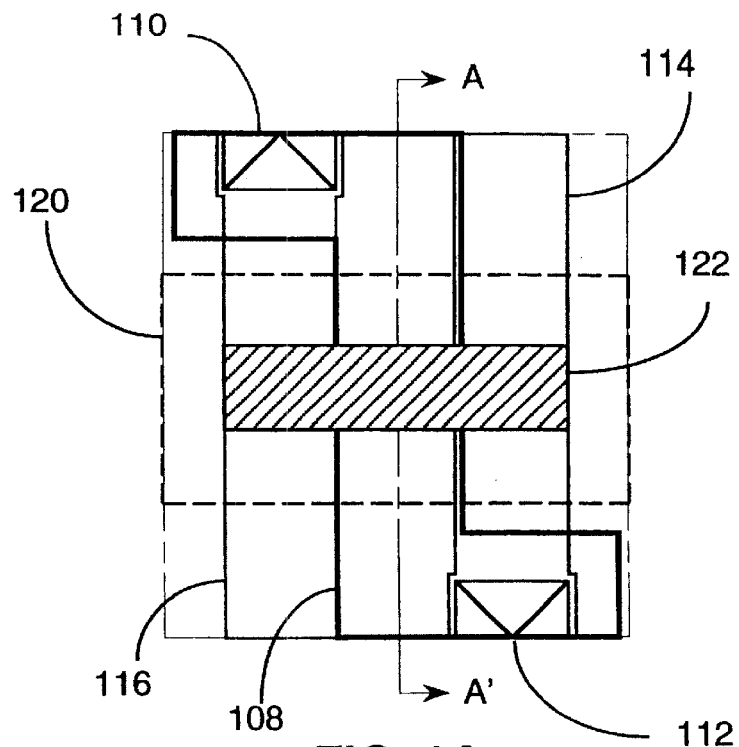
FIGS. 1A and 1B are new diagrams of a nonvolatile memory cell.
Figure 1B:
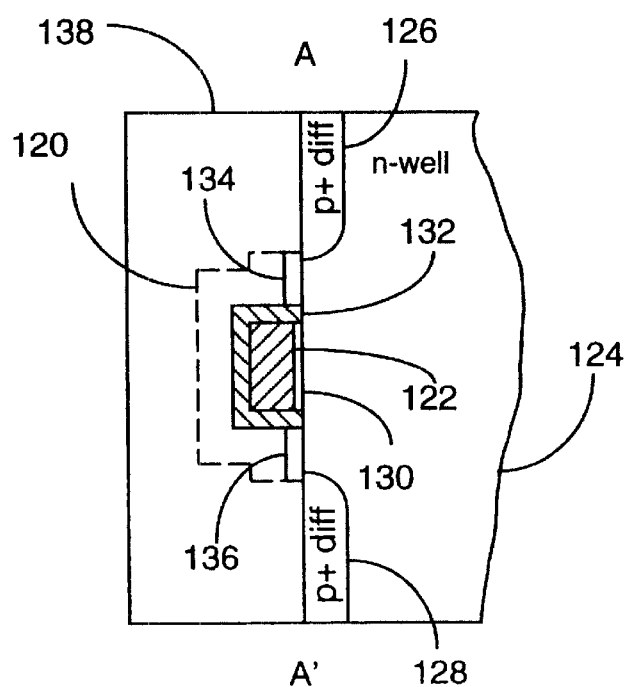
Figure 2A:
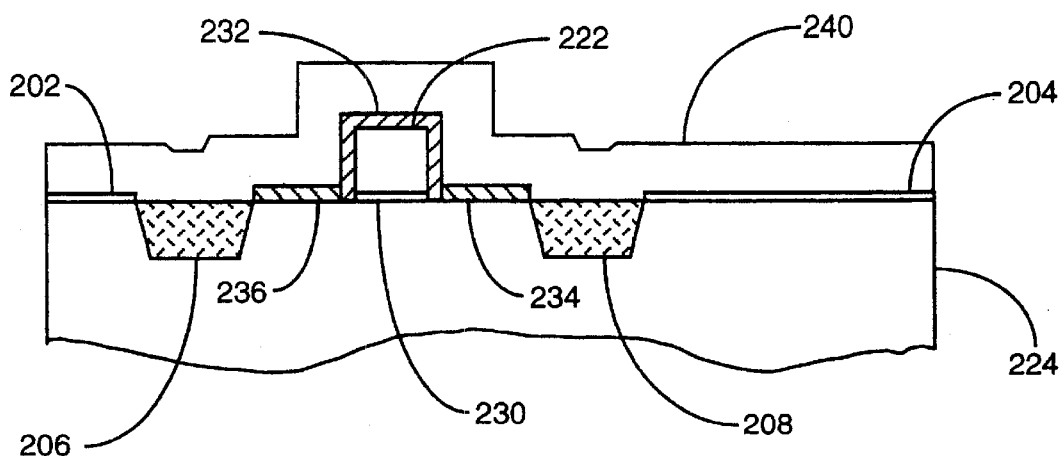
FIGS. 2A–2C are cross section diagrams illustrating steps in a process flow according to one aspect of the invention.
Figure 2B:
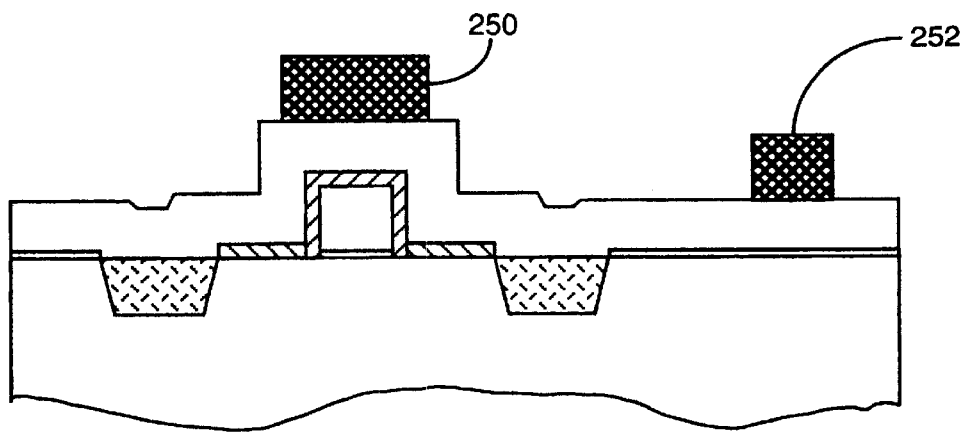
Figure 2C:
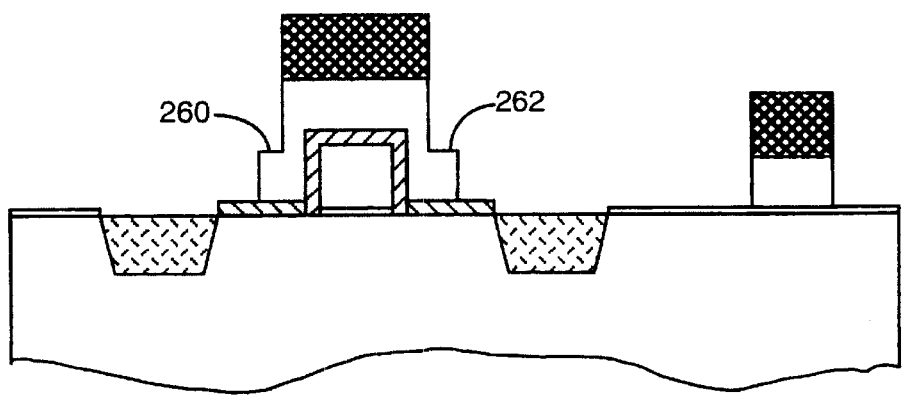

FIGS. 2A–2C are diagrams of a method for forming an EEPROM cell together with transistors for peripheral circuits according to the present invention. FIG. 2A shows a semiconductor substrate 224 on which are formed the several dielectric layers 202, 204, 206, 208, 230, 234, and 236. Dielectric layers 230, 234, and 236 correspond to layers 130, 134, and 136, respectively, in FIG. 1. In an exemplary non-limiting embodiment of the present invention, layer 230 acts as the gate dielectric for the floating gate transistor with gate electrode 222 while layers 234 and 236 will be used for the gate dielectrics for select transistors. In yet another exemplary non-limiting embodiment of the present invention, these elements would typically all lie in the memory array of an integrated circuit.

In an exemplary non-limiting embodiment of the present invention, the dielectric layers 202 and 204 may be employed to act, in part, as gate dielectrics for transistors formed in areas of the integrated circuit not included in the memory array.

In yet another exemplary non-limiting embodiment of the present invention, the dielectrics 206 and 208 fill grooves cut into the surface of the semiconductor body 224 to form what is usually referred to as shallow trench isolation. This shallow trench isolation is used to provide electrical isolation between different active areas, i.e. to prevent carrier flow between isolated electrical elements that are disposed on the surface of the wafer. A layer of dielectric 232 is shown covering the sides and top of the electrode 222 which corresponds to the dielectric 132 shown in FIG. 1. All of these features can be formed by means familiar to those of ordinary skill in the art. One presently preferred method for forming such features is disclosed in U.S. Pat. No. 5,986,931.

A layer of a conductor 240 is deposited to conformally cover the dielectric layers 202, 204, 206, 208, 234, 236, and 232. This conductor layer may consist of a metal or semiconductor layer. In an exemplary non-limiting embodiment of the present invention, if a the layer is a semiconductor layer, it may be deposited in a high resistance state that may be later modified by doping using methods known to those of ordinary skill in the art to reduce the resistance of the layer.

In preferred embodiments of the present invention, layer 240 is pattered so as to form a structure that extends a short distance beyond the sides of electrode 222 to form select transistors of short channel length as described above. It is also desirable to form in the same operation traces elsewhere on the surface of the semiconductor body which can be used as gate electrodes for transistors or interconnection conductors. As will be appreciated by those having ordinary skill in the art, the present invention discloses a method for achieving these ends that is both simple and uses known semiconductor manufacturing techniques.

After the conducting layer is deposited, it is coated with photoresist. The resist is selectively exposed to radiation that modifies the properties of the resist so that the resist can be "developed" to leave the resist coating in selected locations and remove it in others. The preferred form of radiation is ultraviolet light, but x-rays, or beams of electrons or ions may be used. The various methods for creating patterns of photoresist is well known to those of ordinary skill in the art. Two remaining resist patterns 250 and 252 are shown in FIG. 2B Because conductive layer 240 is a conformal coating, it forms a sidewall over the floating gate electrode 222 and its enveloping dielectric that extends beyond the edge of the dielectric by an amount equal to the thickness of the conducting layer. Resist pattern 250 is positioned so that its edge lies between the outer edge of dielectric 232 and the sidewall edge of the layer 240 formed where it passes over the electrode 222.

In an exemplary non-limiting embodiment of the present invention, the vertical thickness of the sidewall is given by $$tvsw = tp1 + tp2 + tipd$$

where tvsw is the vertical thickness of the sidewall, tp1 is the thickness of the floating gate electrode 222, tp2 is the thickness of the conducting layer 240 when lying over a planar region, and tipd is the thickness of the dielectric 232 that separates the floating gate electrode 222 from the conducting layer 240.

After the resist pattern is defined, the conducting layer 240 is anisotropically etched to remove an amount of material equal in thickness to $$taswe = tp2 + \Delta,$$

where $\Delta < tp1 + tipd$.

This guarantees that there is a "foot" of layer 240 remaining that extends a distance tp2 from the edge of the dielectric layer 232 as is seen as features 260 and 262 in FIG. 2C. At the same time the "overetch" should be sufficient to account for minor variations in thickness of the conducting layer and its etch rate across the surface of the semiconducting wafer. The overetch should also be enough to remove the conducting layer from small steps such as the transition from dielectric 236 to dielectric 206.

In an exemplary non-limiting embodiment of the present invention, $\Delta$ is chosen to be 20% to 30% of tp2. By way of a non-limiting example, if tp1 =tp2=0.25 $\mu$m and tipw=0.03 $\mu$m, the anisotropic etch might be chosen to remove 0.33 $\mu$m of the conducting layer which results in an overetch of 30%. This would result in a foot with a vertical thickness of 0.20 $\mu$m. Assuming that dielectric layers are 210 and 212 are 0.025 $\mu$m thick and that the tolerance in the thickness of layer 240 is <6%, there is sufficient margin to assure removal of the layer 240 over the step from dielectric layer 236 to dielectric layer 210.

Notice that the same process that leaves the structure with feet 260 and 262 on the conducting layer 240 where it extends over the floating gate 222 leaves an isolated trace under the photoresist layer 252. This trace can be used as gate electrode for a transistor or an interconnection conductor.

After the anisotropic etch, the photoresist is removed from the wafer and the processing proceeds in a manner familiar to those of ordinary skill in the art. A presently preferred method is disclosed in U.S. Pat. No. 5,986,931. The process may include forming a dielectric layer over the complete wafer, selectively making openings in this dielectric layer to provide access to conductors formed in the substrate and on the face of the wafer, and selectively providing metal connections on the surface of the top dielectric layer between the openings to interconnect the devices into an integrated circuit.

One advantage of this method is that the channel lengths of the cell select gates are determined by the thickness of the conducting layer from which it is formed and are of equal size. By way of a non-limiting example, if the conducting layer is 0.25 $\mu$m thick and its thickness is controlled to 6%, the length of the gate electrodes is controlled to 15 nm. Another advantage is that these select gates can be formed at the same time as the other transistors in the circuit without any special processing. Yet another advantage is that in some cases, the select gate length may be less than the minimum feature size that the lithographic process can define with good control.

The limitations on the minimum thickness of the layer to be etched for this aspect of the present invention to be effective is that the thickness of the layer must be greater than twice the error in the position of the resist edge. A practical upper bound is that the layer to etched must be no greater than about twice the thickness of the step that forms the sidewall.

Figure 3A:
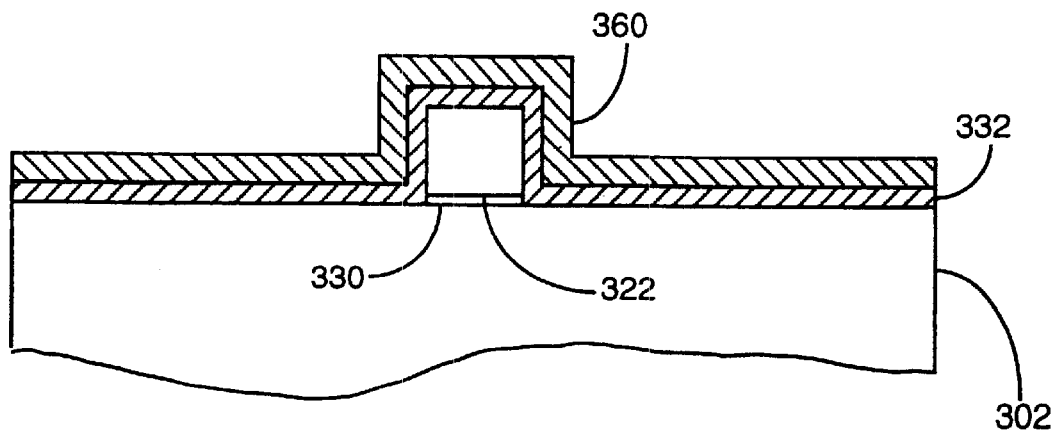
FIGS. 3A–3C are cross section diagrams illustrating steps in a process flow according to another aspect of the invention.
Figure 3B:
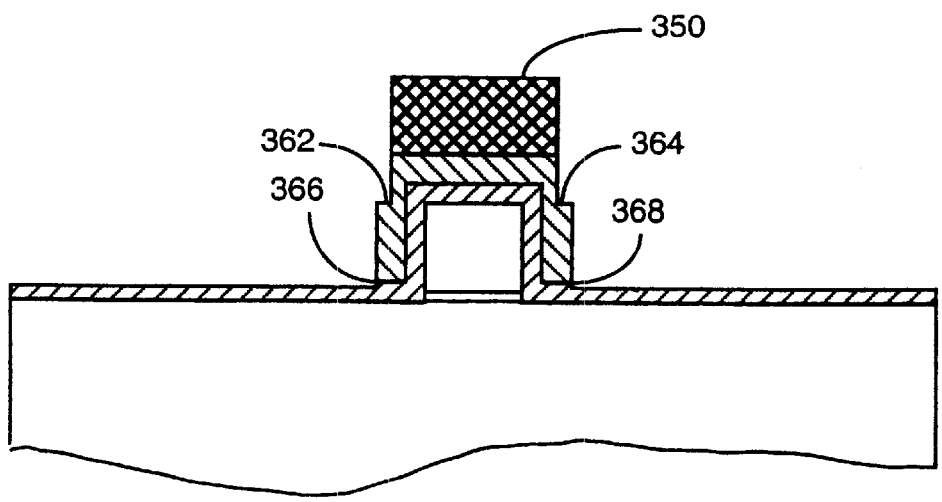
Figure 3C:
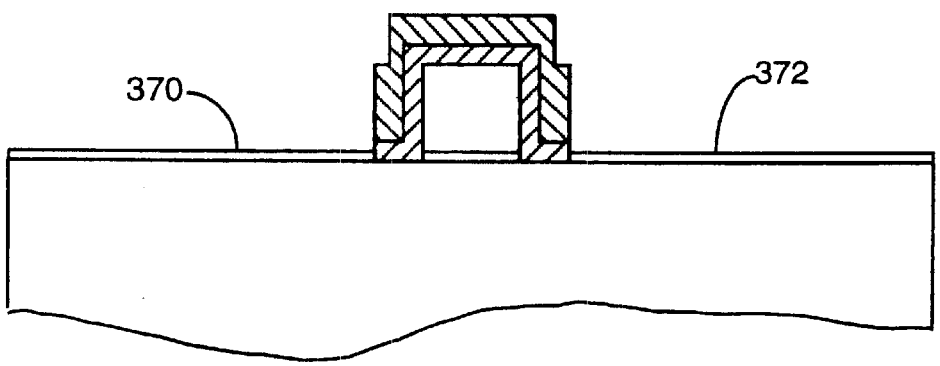

FIGS. 3A–3C are diagrams of yet another aspect of the present invention. In the aspects of FIGS. 3A–3C, a technique according to the present invention is used to restrict a trilayer silicon oxide/silicon nitride/silicon oxide sandwich dielectric to a region surrounding an electrode and a very small region extending over the surface on which the electrode is formed.

As is known by those skilled in the art of nonvolatile memory, it is common to use such a trilayer dielectric, commonly referred to as ONO, as the dielectric between a floating electrode on which charge is to be stored and an overlying conducting electrode which is desirably strongly capacitively coupled to the floating electrode because it has been shown that ONO layers can combine high capacitance per unit area with very low charge leakage under storage conditions of the memory. However, there are concerns about the threshold stability of transistors that employ ONO as a gate dielectric. Consequently, it may be desirable to restrict the ONO to the immediate vicinity of the floating gate electrode and employ oxide as the dielectric over the bulk of the gate channel length. By utilizing methods according to the present invention, such a result may be achieved.

FIG. 3A is a diagram showing a floating gate electrode 322 disposed on a dielectric layer 330 which is formed on a semiconducting substrate 302. A trilayer dielectric layer 332 has been formed conformally over the exposed semiconductor surface and the floating electrode 322. A layer of oxide 360 has been disposed conformally over the exposed surface of the ONO dielectric. In an exemplary non-limiting embodiment of the present invention, the thickness of this oxide layer is chosen to be greater than twice the placement accuracy of an edge of a photoresist pattern in the technology being employed. By way of a non-limiting example, if a photo resist edge can be placed with an accuracy of 0.05 $\mu$m, the thickness of the oxide layer might be chosen to be 0.12 $\mu$m.

After the structure shown in FIG. 3A is formed, a layer of photoresist is deposited and patterned in a manner well known to those of ordinary skill in the art. In an exemplary non-limiting embodiment of the present invention, the layer is patterned such that the edges of the photoresist pattern lie half way between the vertical faces of ONO dielectric that are not in contact with the floating electrode and the exposed vertical faces of the top deposited oxide layer.

A selective, anisotropic oxide etch is then performed. In an exemplary non-limiting embodiment of the present invention, the etch is chosen to remove oxide equal in thickness to about 130% of the deposited oxide. Thus, in the previous example, 0.16 $\mu$m of oxide would be removed.

The structure resulting from the above process is shown in FIG. 3B. The resist pattern is shown as the double cross hatched rectangle 350. The etch has removed the oxide layer from most of the surface of the semiconductor wafer. There are two shoulders 362 and 364 etched into the sidewalls of the deposited oxide 360 that lie along the edges of the floating electrode. Because the top oxide of the ONO dielectric is quite thin, typically less than 10 nm, it is also removed in this process from the exposed surface which results in the small steps 366 and 368 shown in FIG. 3B.

After the anisotropic oxide etch, the photoresist is removed by well known means and the wafer exposed to a selective, isotropic nitride etchant. In an exemplary non-limiting embodiment of the present invention, concentrated H3PO4 at 160° C. may be used.

This results in the structure shown in FIG. 3C. The deposited oxide layer protects the nitride layer where it remains. This results in the bottom oxide layer of the ONO dielectric remaining in the exposed regions 370 and 372 and the complete ONO stack remaining in the region covered by the deposited oxide.

The deposited oxide and the remaining exposed oxide layers 370 and 302 may then be removed with a selective, isotropic etchant such as dilute hydrofluoric acid and the top oxide layer of the ONO dielectric and the oxide on the exposed semiconductor regions can be reformed by thermal oxidation, oxide deposition, or a combination by means well known to those of ordinary skill in the art.

As will be appreciated by those having ordinary skill in the art, the result of a process according to the present invention is an ONO dielectric layer that is restricted to covering the floating electrode and a small proximate region extending over the semiconductor surface. Thus, in the previous example, this proximate region may measure only about 0.12 $\mu$m from its sides.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for forming an EEPROM cell together with transistors for peripheral circuits comprising:

providing a semiconductor substrate, a gate dielectric layer disposed over said substrate, an electrode disposed over said gate dielectric layer, said electrode further enveloped in an electrode dielectric layer, and a select gate dielectric layer disposed on either side of said electrode dielectric layer;

conformally depositing a conductive layer over said electrode dielectric layer and said gate dielectric layers;

coating said conductive layer with photoresist;

selectively exposing said photoresist to radiation to form a sidewall over said electrode;

anisotropically etching said conductive layer, wherein said act of anisotropically etching said conductive layer removes an amount of material equal in thickness to the thickness of said conducting layer+$\Delta$, where $\Delta$<the sum of the thickness of said electrode+the thickness of said gate dielectric layer and wherein said act of etching said conductive layer results in a layer of said conductive material remaining which extends a distance from said electrode dielectric layer equal to the thickness of said conducting layer, and wherein $\Delta$ is chosen to be 20% to 30% of the thickness of said conductive layer; and whereby said method is characterized in that a predetermined amount of material remains proximate to the edge of said electrode forming a structure that extends a short distance beyond the sides of said electrode.

2. The method of claim 1, wherein said act of conformally depositing a conductive layer over said electrode dielectric layer and said gate dielectric layers is further characterized in that said conformal deposit forms a sidewall over said electrode and said electrode enveloping dielectric layer, said conductive layer extending beyond the edge of said electrode dielectric by an amount equal to the thickness of said conducting layer.

3. The method of claim 2, wherein said act of coating said conductive layer with photoresist is further characterized in that said photoresist is positioned such that the edge of said photoresist lies between the outer edge of said electrode dielectric layer and said sidewall of said conductive layer.

4. The method of claim 2, wherein the vertical thickness of said sidewall is approximately equal to the sum of the thickness of said electrode, the thickness of said conducting layer, and the thickness of said electrode dielectric layer.

5. A method for forming a trilayer EEPROM cell together with transistors for peripheral circuits comprising:

providing a semiconductor substrate, said substrate having a gate dielectric layer disposed over said substrate and an electrode disposed over said gate dielectric layer;

conformally forming a trilayer dielectric layer over said electrode and over the exposed surface of said substrate;

conformally forming a layer of oxide over the exposed surface of said trilayer dielectric, wherein the thickness of said oxide layer is chosen to be greater than twice the placement accuracy of an edge of a photoresist pattern in the technology being employed;

depositing a layer of photoresist over said oxide layer;

etching said photoresist; and whereby said method is characterized in that said trilayer layer is restricted to covering said electrode and a small proximate region extending over said substrate surface.

6. The method of claim 5, wherein said photoresist layer is patterned such that the edges of said photoresist pattern lie approximately half way between the vertical faces of said trilayer dielectric that are not in contact with said floating electrode and the exposed vertical faces of said oxide layer.

7. The method of claim 5, where said act of etching is chosen to remove an amount of said oxide layer equal in thickness to about 130% of said oxide layer.

8. The method of claim 7, wherein said act of etching results in two shoulders being etched into the sidewalls of said oxide layer which lie along the edges of said electrode.

9. The method of claim 5, whereby an isolated trace is left under said photoresist layer.

10. The method of claim 9, whereby said isolated trace functions as a gate electrode for a transistor.

11. The method of claim 9, whereby said isolated trace functions as an interconnection conductor.

* * * * *